United States Patent [19]

Nishizawa et al.

[11] Patent Number: 4,866,500

[45] Date of Patent: Sep. 12, 1989

[54] INTEGRATED LIGHT-TRIGGERED AND LIGHT-QUENCHED STATIC INDUCTION THYRISTOR AND MAKING METHOD THEREOF

[75] Inventors: Jun-ichi Nishizawa; Takashige Tamamushi; Ken-ichi Nonaka, all of Sendai, Japan

[73] Assignee: Zaidan Hojin Handotai Kankyu Shinkokai, Sendai, Japan

[21] Appl. No.: 100,368

[22] Filed: Sep. 23, 1987

[30] Foreign Application Priority Data

Sep. 26, 1986 [JP] Japan ............................ 61-229251

[51] Int. Cl.⁴ ............................................. H01L 29/74
[52] U.S. Cl. ..................................... 357/38; 357/20; 357/22; 357/30; 357/46; 357/55; 357/56; 357/86
[58] Field of Search ............... 357/20, 38, 46, 22, 357/56, 30, 55, 86

[56] References Cited

U.S. PATENT DOCUMENTS 4,721,682  1/1988  Graham et al. ...................... 357/50

FOREIGN PATENT DOCUMENTS 0158186  10/1985  European Pat. Off. .
3011484  10/1980  Fed. Rep. of Germany .
60-198779  10/1985  Japan .
61-54668   3/1986  Japan .
62-111470  5/1987  Japan .

OTHER PUBLICATIONS

IEEE Trans on Elec. Dev., vol. ED-27#11, "Buried-Grid Field-Controlled Thyristors Fabricated Using Silicon Liquid-Phase Epitaxy" B. Jayant Baliga, 1980 pp. 2141-2145.
"Totally Light Controlled Thyristor-Optically Triggerable and Optically Quenchable Static Induction Photo-Thyristor" Jun-ichi Nishizawa, Takashige Tamamushi & Ken-ichi Nonaka pp. 321-324, extended abstracts of 16th (1984 int.) conf. opn S.-S. devices & materials, Kobe.

Primary Examiner—Joseph E. Clawson, Jr.
Attorney, Agent, or Firm—Cushman, Darby & Cushman

[57] ABSTRACT

An integrated light-triggered and light-quenched static induction thyristor and fabrication process thereof adapted in such a manner that an integrated SIPT operates in the normal mode in order to enhance current gain, tail current generated at the light-quenching time is reduced in order to enhance turn-off gain, and a buried-gate type of light-triggered static induction thyristor and a photo-darlington circuit composed of a first and second static induction phototransistors are integrated on a high-resistivity substrate in order to permit manufacturing said thyristor compact as a whole in facilitated processes.

18 Claims, 19 Drawing Sheets

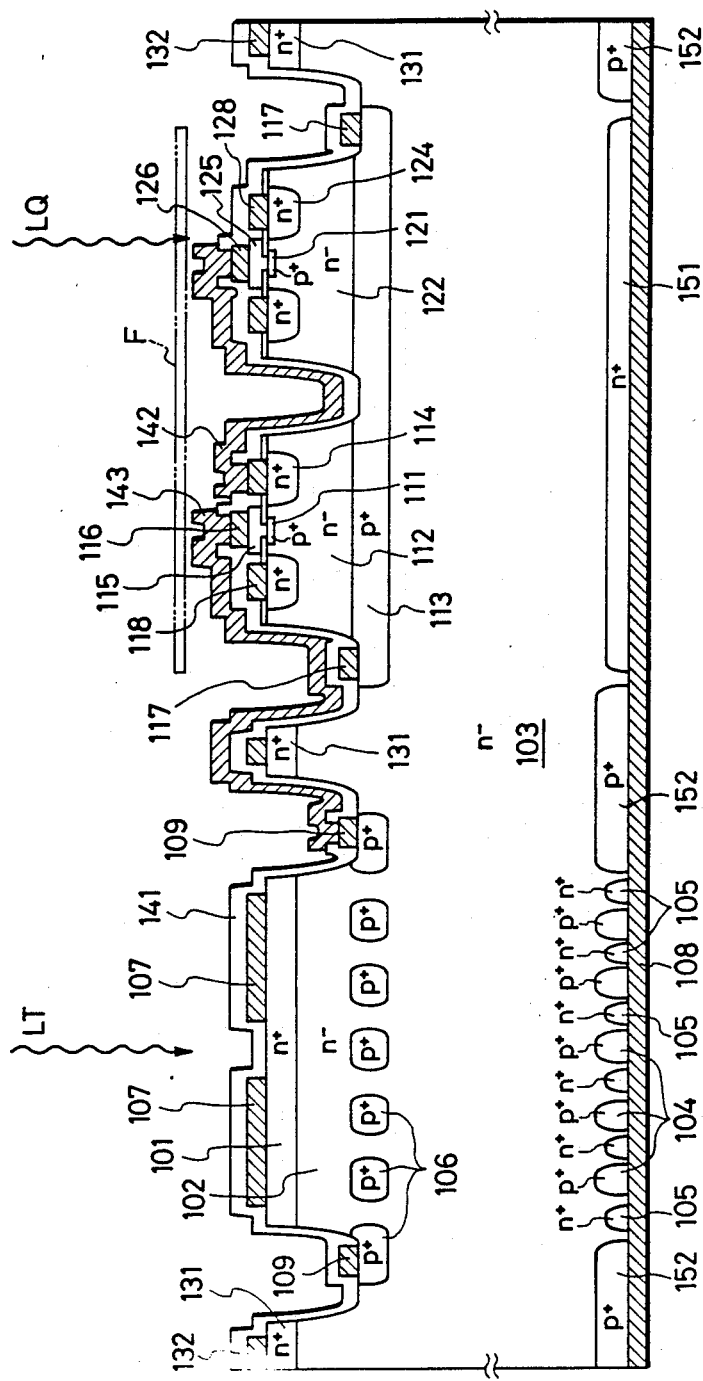

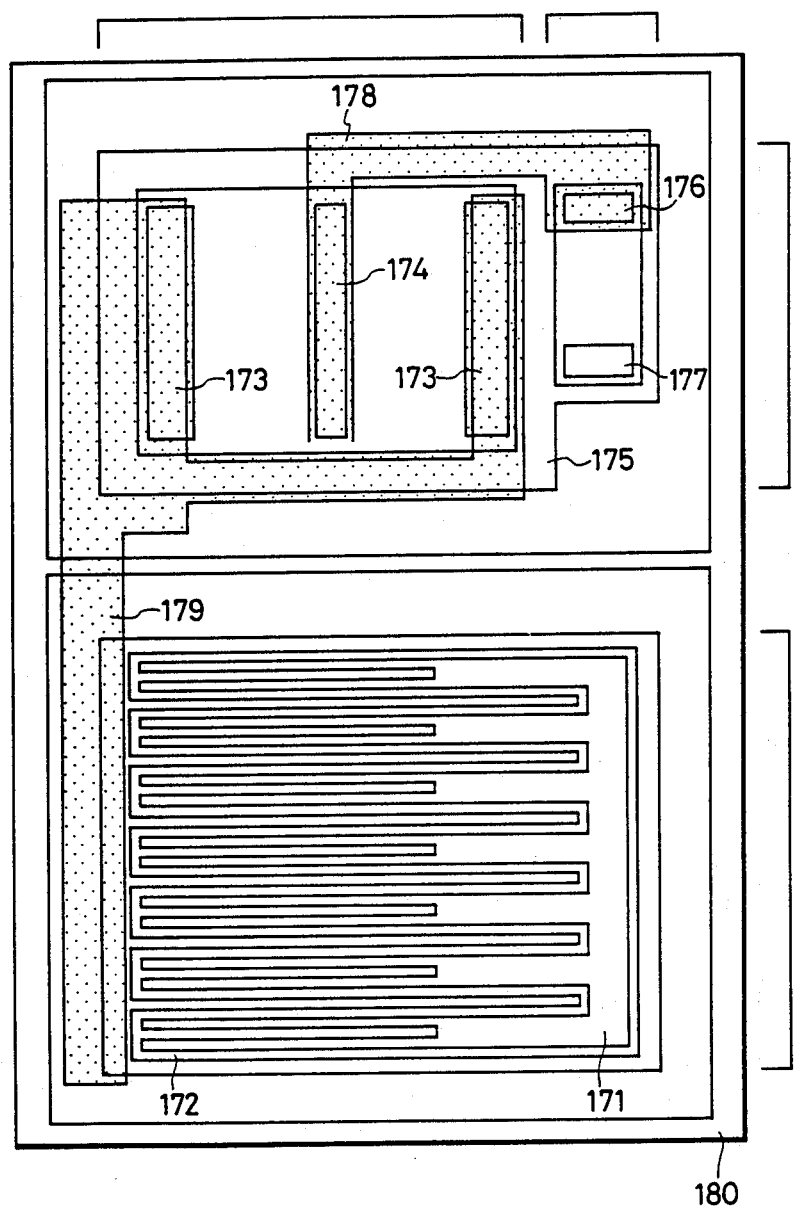

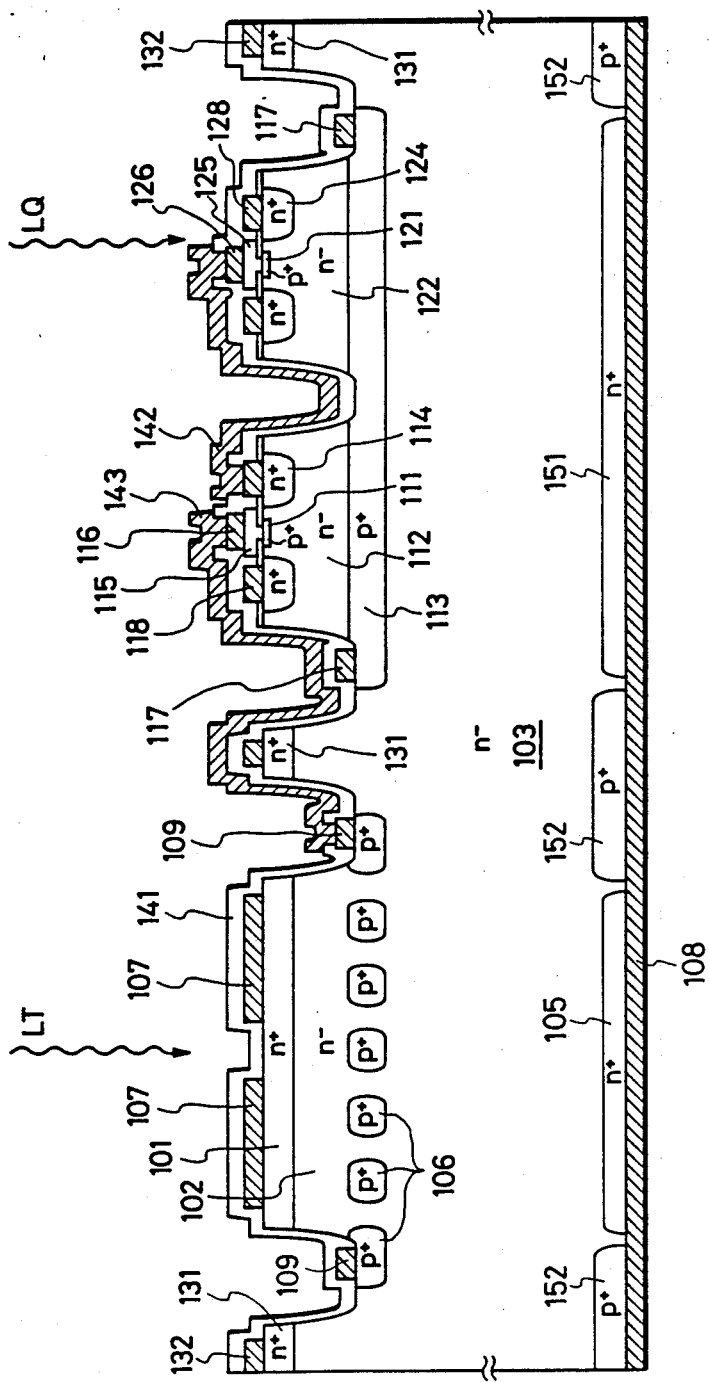

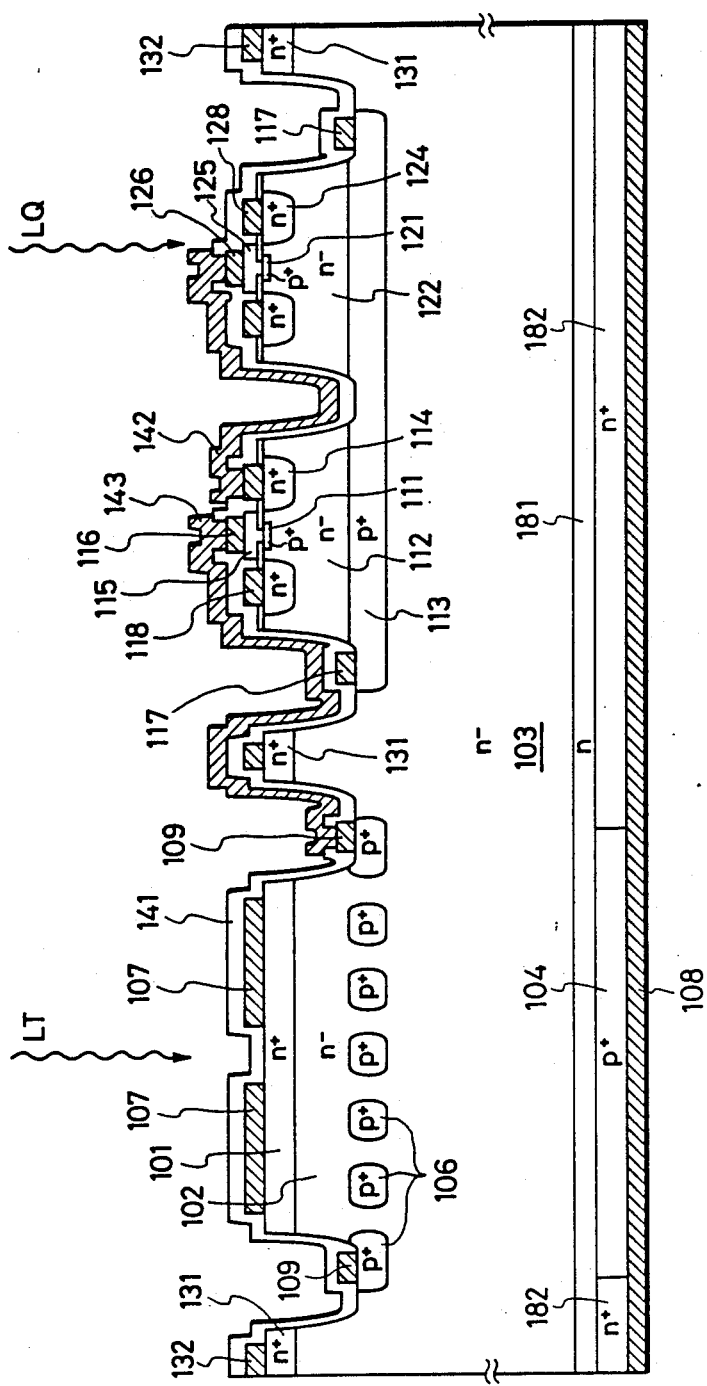

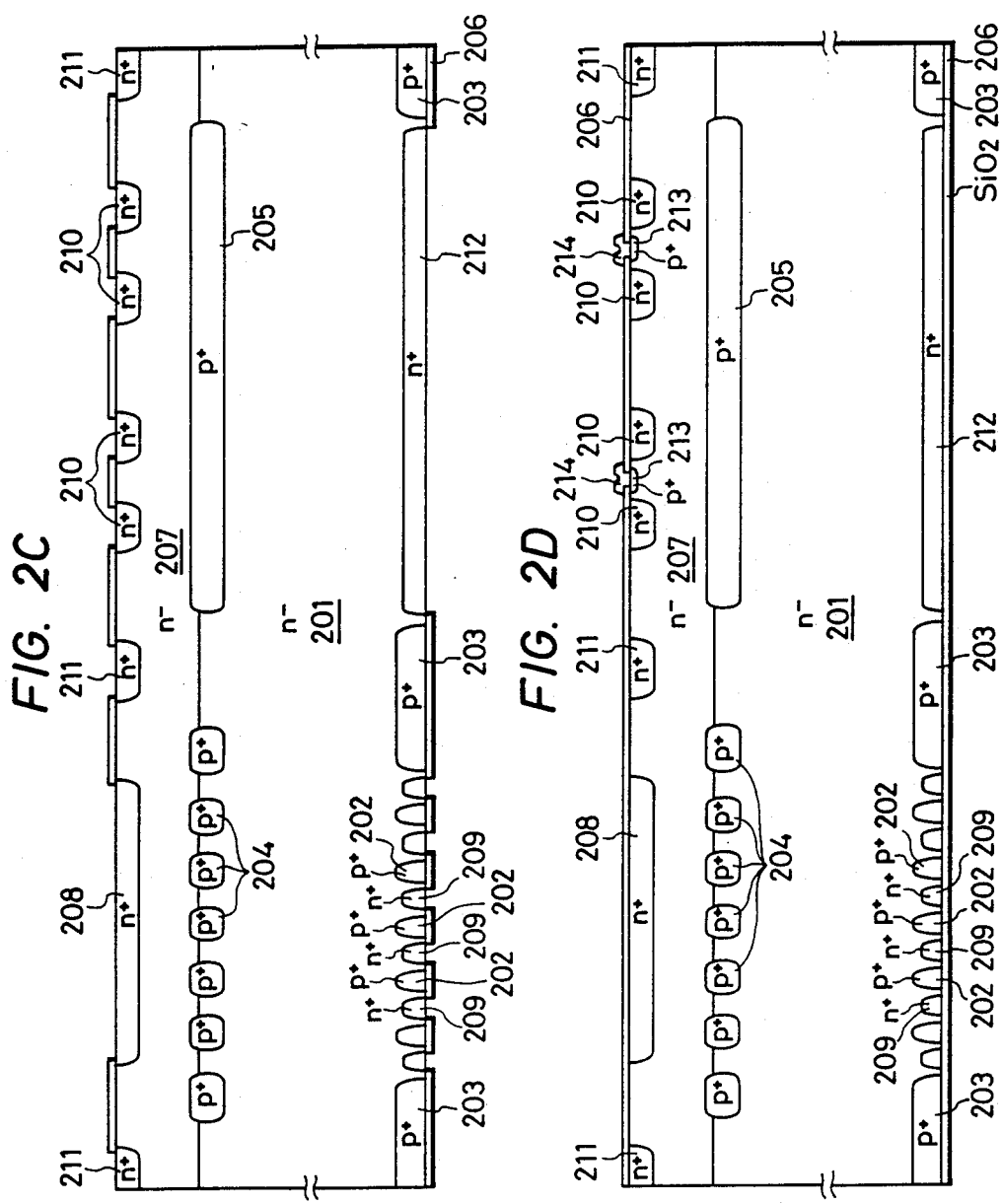

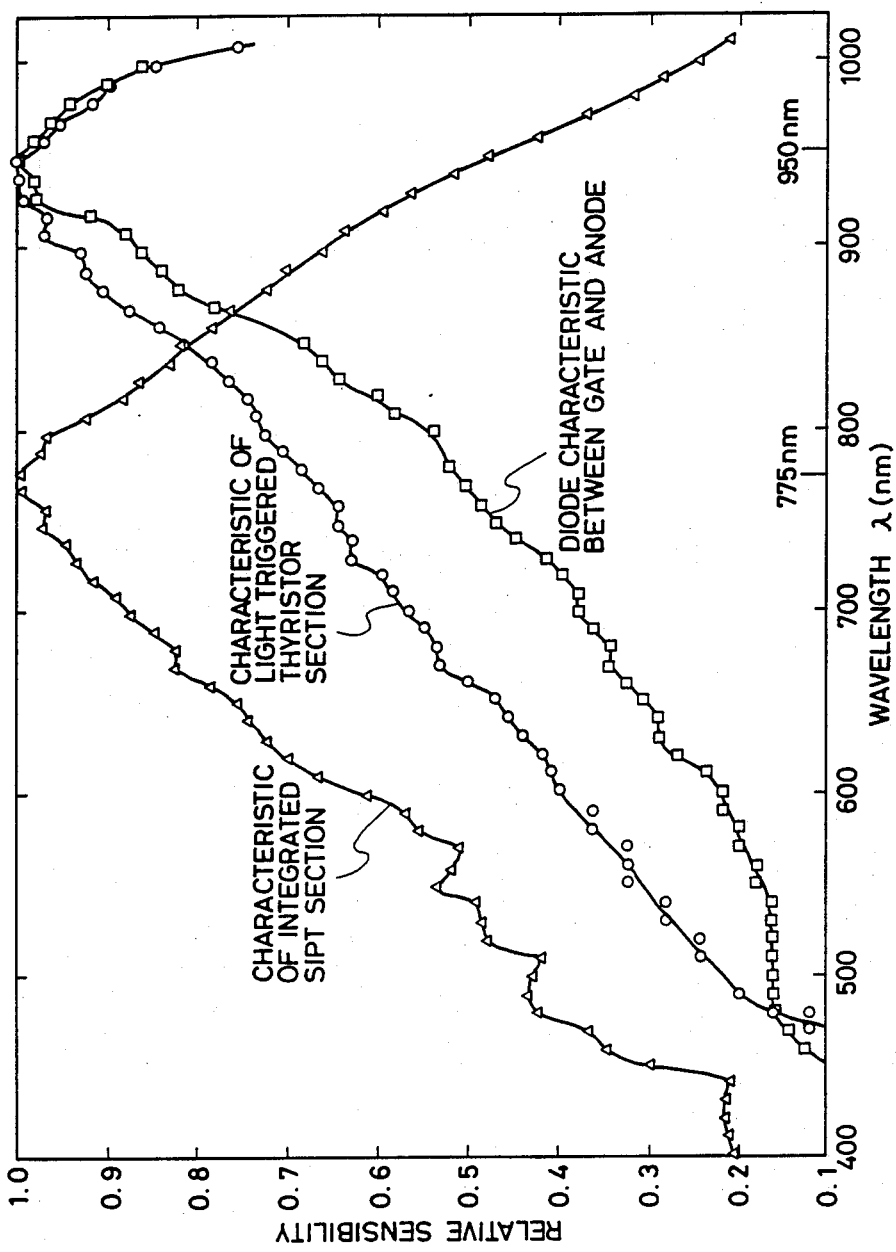

INTEGRATED LIGHT-TRIGGERED AND LIGHT-QUENCHED STATIC INDUCTION THYRISTOR AND MAKING METHOD THEREOF

BACKGROUND OF THE INVENTION (a) Field of the invention:

The present invention relates to a formation and making method of an integrated light-triggered and light-quenched static induction thyristor (hereinafter abbreviated as LTQSI thyristor) composed by integrating a light-triggered static induction thyristor (hereinafter abbreviated as LTSI thyristor) and static induction phototransistors (hereinafter abbreviated as SIPTs) or a photodarlington circuit including a light-triggered static induction thyristor and static induction phototransistors.

(b) Description of the prior art:

Formational examples of LTQSI thyristors have already been proposed by Japanese Patent Preliminary Publication Nos. Sho 60-198779 and Sho 61-54668 whereas and a making method thereof has been disclosed by Japanese Patent Preliminary Publication No. Sho 62-11470. The LTQSI thyristors proposed by these patents, however, have a drawback that the SIPT thereof has a current gain level lower than that obtainable by the SIPT operated in the normal mode since the former is operated in the inverse mod when quenched by light.

SUMMARY OF THE INVENTION

A primary object of the present invention is therefore to provide an integrated light-triggered and light-quenched static induction thyristor including integrated SIPTs so adapted as to operate in the normal mode for enhancing the current gain level, and a making method thereof.

Another object of the present invention is to provide an integrated light-triggered and light-quenched static induction thyristor so adapted as to have a favorable light-quenched characteristic and reduce the tail current at the time of light quenching for the purpose of enhancing the turn-off gain, and a making method thereof.

A third object of the present invention is to provide an integrated light-triggered and light-quenched static induction thyristor manufacturable relatively easily and having very high performance regardless of its compact design, and a making method thereof.

According to the present invention, these objects can be accomplished by adopting a formation electrically isolating with a high breakdown voltage the buried-gate regions of the LTSI thyristor from the buried layer region (drain region) to be used as one of the main electrodes of the SIPTs, finding a formation to integrate a photodarlington circuit using the SIPT and adopting an anode shortening composition.

The integrated LTQSI thyristor according to the present invention is utilizable effectively for converters and similar devices not only of medium and low electric power but also of high electric power since said thyristor is capable of performing DC-AC conversion of high power at high speed and with high efficiency simply by light triggering pulses and light quenching pulses, and isolating the control circuit completely from high-power circuit.

These and other objects as well as the features and the advantages of the present invention will be apparent from the following detailed description of the preferred embodiments when taken in conjunction with the accompanying drawings.

BRIEF DESCRIPTION OF THE DRAWINGS

FIGS. 1A and 1B are a sectional view and a top view illustrating a first embodiment of the integrated LTQSI thyristor according to the present invention:

FIGS. 1C through 1H are sectional views illustrating other embodiments different from one another of the integrated LTQSI thyristor according to the present invention:

FIGS. 2A through 2H are schematic diagrams illustrating an example of manufacturing processes of the integrated LTQSI thyristor according to the present invention;

FIG. 5 is a diagram illustrating spectral response characteristics of portions of the fabricated integrated LTQSI thyristor according to the present invention.

DESCRIPTION OF THE PREFERRED EMBODIMENTS

Figure 1C:
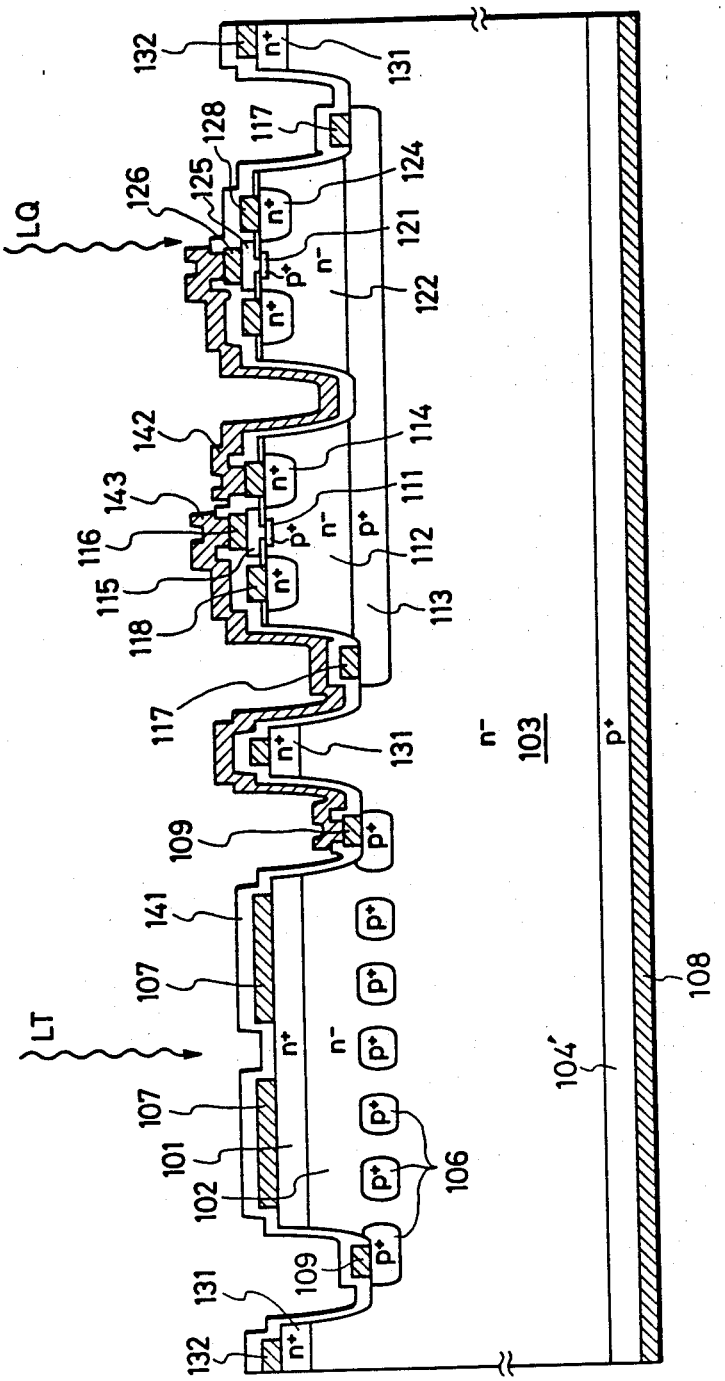

Now, referring to the accompanying drawings, the preferred embodiments of the present invention will be described in details below:

A structure of the integrated LTQSI thyristor according to the present invention is illustrated as the Embodiment 1 in FIGS. 1A and 1B: the former being a sectional view and the latter being a surface structural view. The integrated LTQSI thyristor according to the present invention consists of an buried-gate type of LTSI thyristor having anode-emitter shorted structure and a planar gate type of the p channel SIPT having a photodarlington structure: said LTSI thyristor and SIPT being electrically isolated by n+ isolating region 131, and mutually connected by the two-layered aluminum wiring technique. The LTSI thyristor is composed of n+ cathode regions 101, n− high-resistivity regions 102 and 103, p+ anode regions 104, n+ emitter regions 105, p+ gate regions 106, cathode electrodes 107, anode electrodes 108 and gate electrodes 109. The p+ gate region is formed in a stripe or mesh-like structure and connected on the circumference thereof to the gate electrode 109. The n⁻ high-resistivity region located between the p+ gate regions is a channel region into which electrons are to be injected from the n+ cathode region, and is kept in depletion state due to the diffusion potential between the p+ gate region and the n⁻ high-resistivity region or the reverse bias voltage applied to the gate electrode 109. Potential in the channel region is controlled by the potential of the p+ gate region in the capacitive-coupled mode. Width, length and impurity concentration of the channel are the important factors for determining the forward blocking characteristic, light-triggering and light-quenching characteristics of the LTSI thyristor. The p+ anode regions 104 and the n+ emitter regions 105 are arranged alternately, the former being formed right under the p+ gate regions 106, whereas the latter being right under the channel regions. In the LTSI thyristor of this structure, the electrons disappear from the front surface of the p+ anode region at the time of the turn-off operation since they flow to the n+ emitter region. Therefore, the device structure makes it possible to reduce the tailing time and realize high speed turn-off operation. Said structure makes it possible also to enhance the turn-off current gain (ratio between the anode current and turn-off peak gate current). Further, the adoption of the n+ emitter structure results in reduction of hole injection efficiency from the anode region 104, however, such adoption causes no substantial reduction of the light triggering sensitivity since the gate electrode 109 has the SIT structure and electron injection efficiency from the cathode region 101 is very high in the LTSI thyristor. Though layout of the p+ anode regions and n+ emitter regions is not limited to the manner described above, distance as measured from one n+ emitter region to another n+ emitter region nearest thereto should preferably be not longer than twice the diffusion length of the stored electrons ($2L_n$). Furthermore, in order to increase the value of the forward blocking voltage of the LTSI thyristor, a mesa region is provided around the gate electrode 109, an n+ diffused region for isolation 131 is formed and a metal electrode 132 is arranged. Distance between the gate electrode 109 and said mesa region should be at least equal to the distance between the p+ gate region 106 and the p+ anode region 104. In this formation, potential in the n+ isolation region 133 is nearly equal to that in the p+ anode region 104, and a depletion layer is formed from the p+ gate region 106 toward the mesa region. As a result, concentration of electric field on the device surface can be moderated and forward blocking voltage can be increased. Formed in the cathode electrode 107 is a window for enhancing aperture efficiency for the triggering light.

The p channel SIPT consists of the main SIPT including p+ source regions 111, n⁻ high-resistivity regions 112, a p+ drain region 113, n+ gate regions 114, a p+ source polysilicon layer 115, source electrodes 116, drain electrodes 117 and gate electrodes 118, and of an auxiliary SIPT including p+ source regions 121, n⁻ high-resistivity regions 122, a p+ drain electrode 113 used commonly for the main SIPT, n+ gate regions 124, a p+ source polysilicon layer 125, source electrodes 126 drain electrodes 117 and gate electrodes 128, said p channel SIPT being connected through two wires to the source electrodes 126 of the auxiliary SIPT, gate electrodes 142 of the main SIPT, source electrodes 116 of the main SIPT and gate electrodes 109 of the LTSI thyristor respectively. In FIG. 1A, the reference numeral 141 represents an intermediate insulating layer, whereas the reference numerals 142 and 143 designate metal wires in the second layer. Formed right under the p+ drain region 113 are n+ regions 151. By designing the photosensitive element for light quenching as a photodarlington type of the SIPTs, it is possible to turn off a high current by light. The quenching light is used for irradiating the auxiliary SIPT and may penetrate deeper than the p+ drain region depending on wavelength thereof. In case where the p+ regions are formed right under the p+ drain region, electrons, among the electron-hole pairs generated by the quenching light penetrating deeper than the p+ drain region, are accumulated on the front surface of the p+ anode region 104, thereby causing injection of the holes from the anode regions 104 and turning on the pip photodiode consisting of the p+ drain region 113, n⁻ high-resistance regions 103 and p+ anode regions. In order to prevent this condition, the n+ regions 151 are arranged right under the p+ drain region to form a p+ in+ diode and optical gain is limited below 1 accordingly. Arranged around the p+ drain region 113 is the isolation diffusion region 131 for electrically isolating the p+ gate regions 106 of the LTSI thyristor from the p+ drain region 113 of the p channel SIPT. In FIG. 1B illustrating the surface structure of the device according to the present invention, the reference numeral 171 represents cathode electrodes of the LTSI thyristor, the reference numeral 172 designates gate electrodes of the LTSI thyristor, the reference numeral 173 denotes source electrodes of the main SIPT, the reference numeral 174 represents gate electrodes of the main SIPT, the reference numeral 175 designates drain electrodes of the SIPT, the reference numeral 176 denotes source electrodes of the auxiliary SIPT, the reference numeral 177 represents gate electrodes of the auxiliary SIPT, the reference numeral 178 designates a metal wire in the second layer for connecting the source electrodes of the auxiliary SIPT to the gate electrodes 174 of the main SIPT and the reference numeral 179 denotes a metal wire in the second layer for connecting the source electrodes of the main SIPT to the gate electrodes 172 of the LTSI thyristor.

Now, referring to FIG. 1C, descriptions will be made on the structure of the Embodiment 2 of the integrated LTQSI thyristor. In FIG. 1C wherein the parts similar to those shown in FIG. 1A are represented by the same reference numerals as those used in FIG. 1A, the integrated LTQSI thyristor consists of an integrated LTSI thyristor having no anode-emitter shortening structure and an integrated planar-gate type of p channel SIPT of the photodarlington structure for quenching. A p+ diffused layer 104' common to the anode regions 104 shown in FIG. 1A is formed also right under the p+ drain region of the SIPT.

Figure 1D:
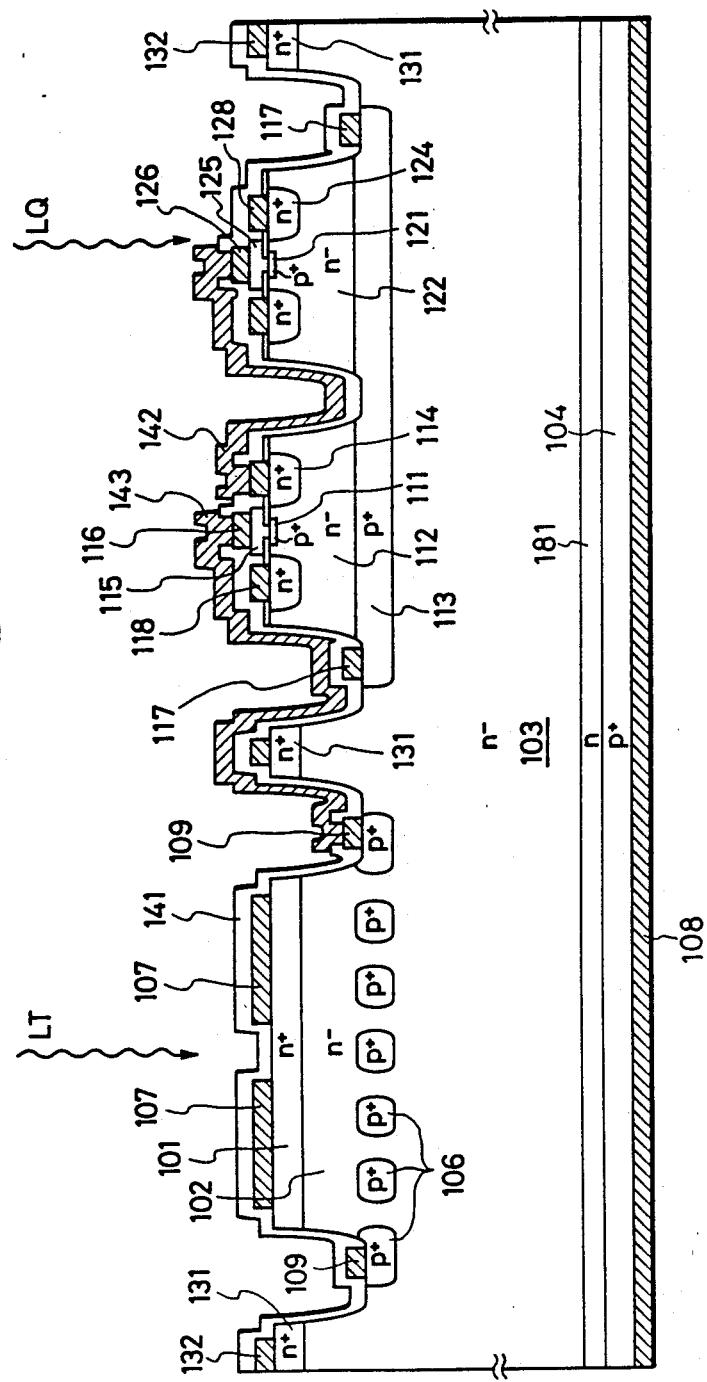

Then, referring to FIG. 1D, the structure of the Embodiment 3 of the integrated LTQSI thyristor according to the present invention will be described. In FIG. 1D wherein the parts similar to those shown in FIG. 1A are designated by the same reference numerals as those used in FIG. 1A, the integrated LTQSI thyristor consists of an LTSI thyristor adopting an n buffer layer 181 and a planar type of p channel SIPT of the darlington structure for quenching. This formation enables to enhance the forward blocking voltage of the LTSI thyristor by adopting the n buffer layer 181.

Referring to FIG. 1E the structure of the Embodiment 4 of the integrated LTQSI thyristor according to the present invention will be explained below. In FIG. 1E wherein the parts similar to those shown in FIG. 1A are denoted by the same reference numerals as those used in FIG. 1A, the structure on the anode side of the LTSI thyristor has the n+ emitter regions 105 right under the n+ cathode regions 101 and the p+ anode regions 104 in the other area, and is characterized in that the n+ regions 151 are formed right under the p+ drain region 113 of the SIPT. This structure allows attempts to enhance the turn-off speed and turn-off gain.

Figure 1F:
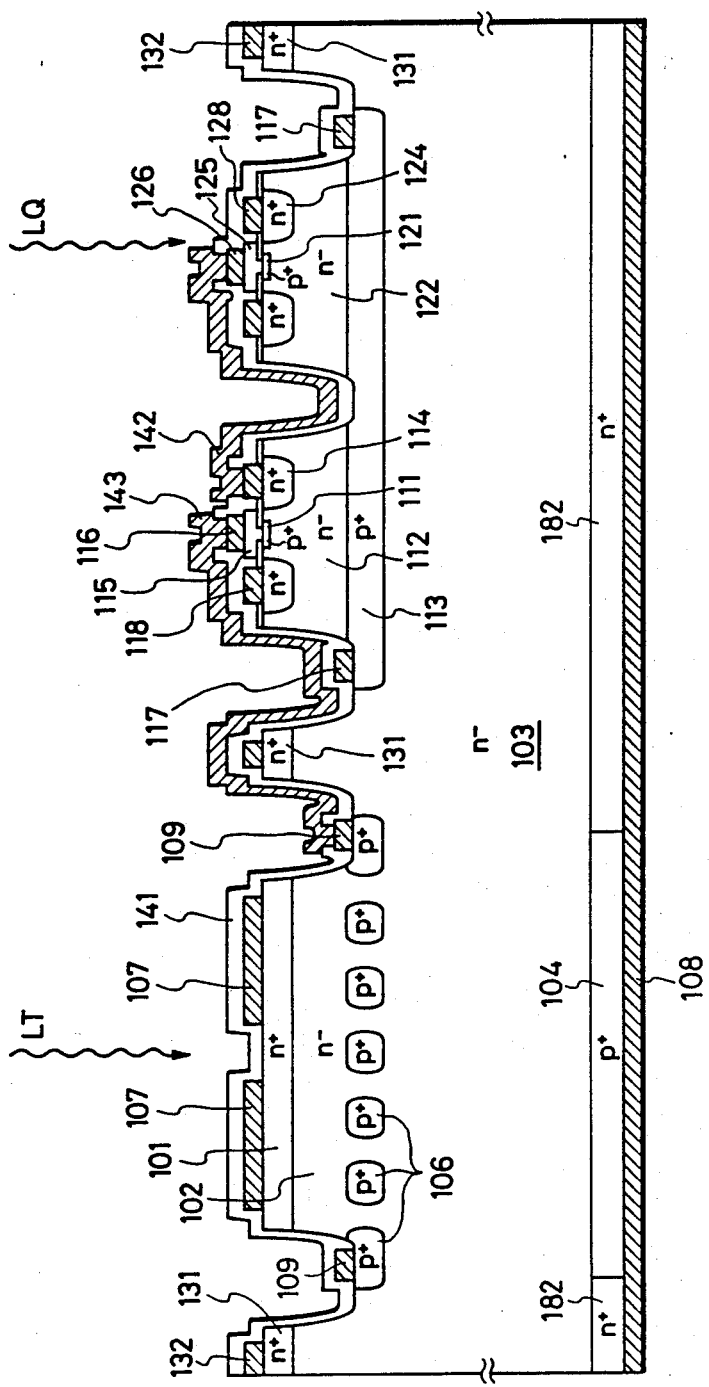

With reference to FIG. 1F, the structure will be described on the Embodiment 5 of the integrated LTQSI thyristor according to the present invention. In FIG. 1F wherein the parts similar to those shown in FIG. 1A are represented by the same reference numerals used in FIG. 1A, the formation is characterized in that uniform p+ anode regions are formed right under the LTSI thyristor and that n+ regions 182 having a diffusion junction depth of the similar degree to that of the p+ anode regions 104 are provided in the other area. This structure has advantages to enable to reduce (minimize) the forward voltage drop in the LTSI thyristor portion and to simplify composition of the LTQSI thyristor having the anode shortening structure.

Referring to FIG. 1G, the formation of the Embodiment 6 of the integrated LTQSI thyristor according to the present invention will be explained below. In FIG. 1G wherein the parts similar to those shown in FIG. 1A are designated by the same reference numerals used in FIG. 1A, an n buffer layer 181 is adopted in the formation illustrated in FIG. 1F. The adoption of this n buffer layer 181 enables the LTQSI thyristor to have a higher blocking voltage and serves to prevent erroneous operation of the SIPT since the n+ anode layer 182 allows the underside anode surface of the SIPT group to be of the p-i-n structure.

Figure 1H:
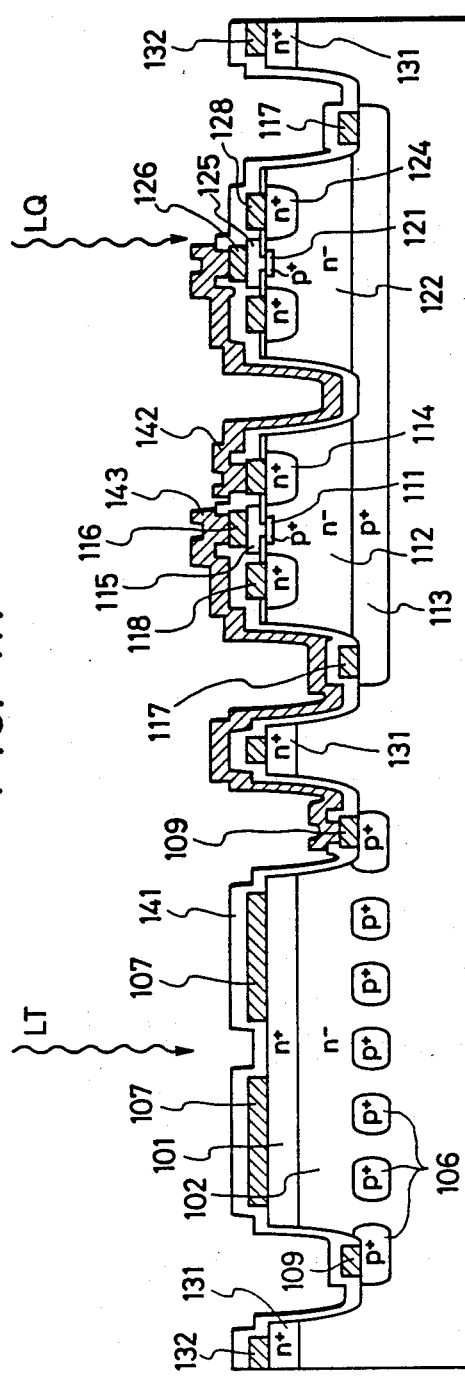

With reference to FIG. 1H, description will be made below on the structure of the Embodiment 7 of the integrated LTQSI thyristor according to the present invention. In FIG. 1H wherein the parts equivalent to those shown in FIG. 1A are denoted by the same reference numerals as those used in FIG. 1A, the structure is characterized in that a two-layer structure of p+ anode regions 183 and n emitter regions 184 are formed on the anode side of the LTSI thyristor, and that n regions 151 are provided right under the p+ drain region 113 of the SIPT. In this case, hole injection efficiency from the anode p+ layer 183 is controllable depending on diffused junction depth of the n emitter regions 184 and the tailing current can be reduced.

Figure 1I:
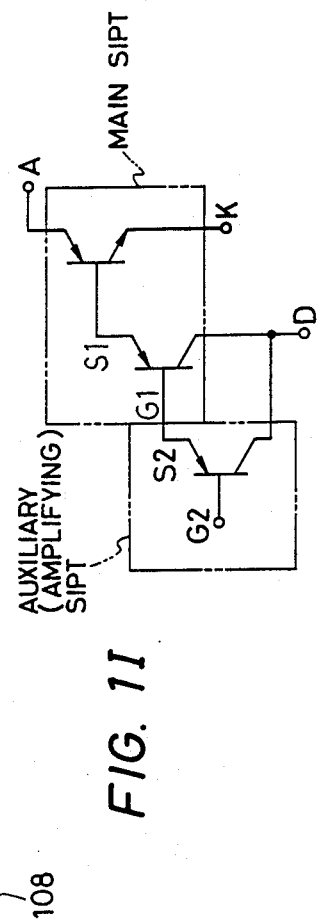
FIG. 1I is a circuit diagram of the integrated LTQSI thyristor according to the present invention.

FIG. 1I shows a schematic circuit diagram of the integrated LTQSI thyristor having the formations illustrated in FIGS. 1A through 1H. In FIG. 1I, the reference symbols A and K represent the anode and cathode of the LTSI thyristor respectively, the reference symbols G1 and S1 designate the gate and source of the main SIPT, the reference symbols G2 and S2 denote the gate and source of the auxiliary SIPT for amplification, and the reference symbol D represents the drain used commonly for the main SIPT and auxiliary SIPT for amplification. The integrated LTQSI thyristor according to the present invention consists of the LTSI thyristor and the photodarlington type of SIPT. The gate of the LTSI thyristor is connected to the source S1 of the main SIPT composing the photodarlington type of SIPT. The photodarlington type of SIPT consists of the main SIPT and the auxiliary SIPT for amplification; the source of the auxiliary SIPT being connected to the gate of the main SIPT whereas the drain D being used commonly for the main SIPT and the auxiliary SIPT.

Now, description will be made on the operations of the Embodiment 1 illustrated as the Embodiment 1 of the integrated LTQSI thyristor according to the present invention. When the surface of the LTSI thyristor is irradiated with the triggering light pulse LT in a state where both the LTSI thyristor and the SIPT are turned off, electron-hole pairs are generated in the n− high-resistivity layer mainly between the p+ buried-gate region 106 and the p+ anode region 104 by the light penetrating into the LTSI thyristor. Electrons among the generated electron-hole pairs are accumulated in the second base formed in the junction between the p+ anode region 104 and the n− high-resistivity layer 103 (or n buffer layer 181), whereas the holes are accumulated into the p+ gate regions 106. By the holes accumulated in the p+ gate regions 106 as described above, potential of the p+ gate regions relative to the electrons in the cathode region 101 is lowered, and along with the lowering, potential at the intrinsic gate point as the saddle point of the potential generated in the n− channel between the p+ gate regions 106 and 106 relative to the electrons in the cathode region 101 is lowered, thereby increasing injection of electrons from the n+ cathode regions 101. In the similar way, by the electrons accumulated in the second base, potential of the second base relative to the holes in the anode region 104 is lowered and injection of holes from the anode region 104 is increased. The injected electrons and holes are accumulated into the second base and the p+ gate regions 106, respectively, the potential barrier in the second base for holes and the potential barrier at the intrinsic gate point for electrons are lowered, and injection of the carriers is increased, finally turning on the LTSI thyristor. Once turned on, the LTSI thyritor is kept in the turned-on condition even after the triggering light pulses are turned off.

When the auxiliary SIPT in the darlington type of SIPT is irradiated with the quenching light pulses LQ at the next step, the auxiliary SIPT is turned on by the light penetrating thereinto to drive the main SIPT When the main SIPT is turned on, the holes so far accumulated in the p+ gate regions 106 of the LTSI thyristor and the holes injected from the p+ anode region 104 are flown out through the main SIPT. Accordingly, the potential of the p+ gate region 106 relative to the electrons in the cathode region 101 and that at the intrinsic gate point relative to the electrons in the cathode region 101 are increased, thereby shutting off the injection of electrons from the n+ cathode region 101. The electrons accumulated in the second base are also reduced due to the recombination with holes or the diffusion into the p+ anode region 104, thereby shutting off the injection of holes from the p+ anode region 104 and turning off the LTSI thyristor. The light triggering and light quenching are performed through the processes described above.

Figure 2A:
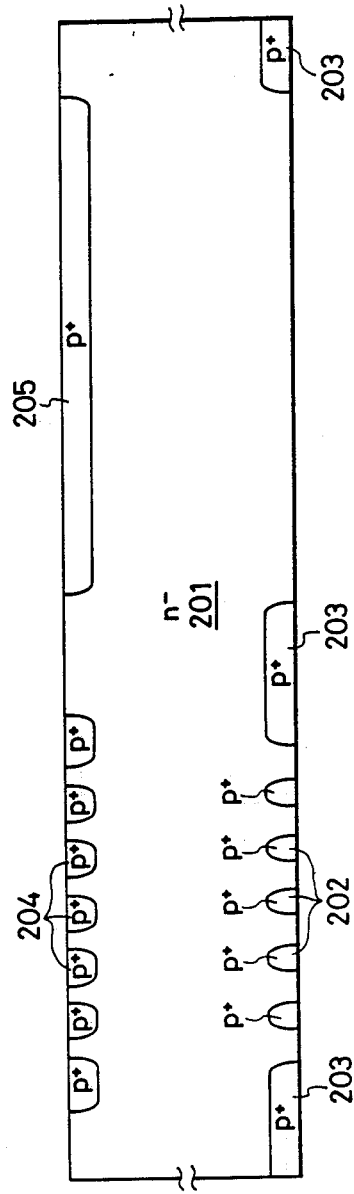
Figure 2B:
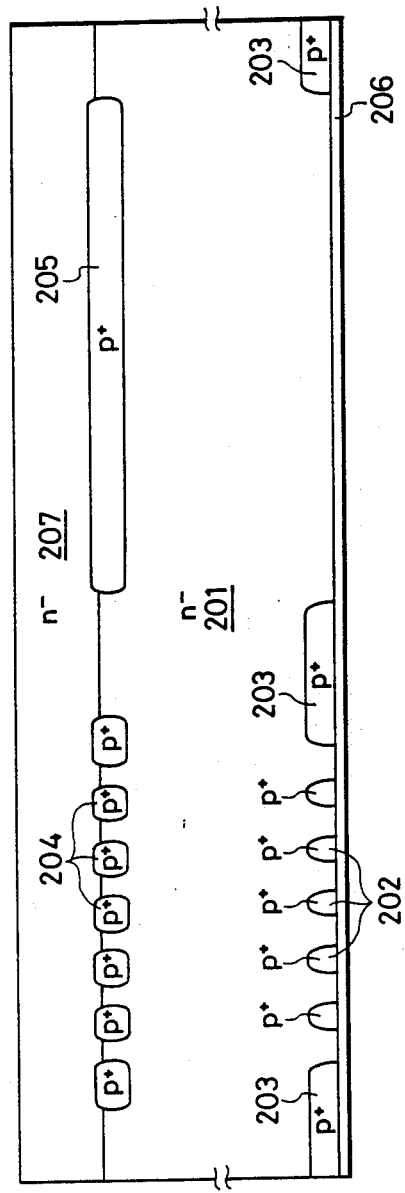
Figure 2E:
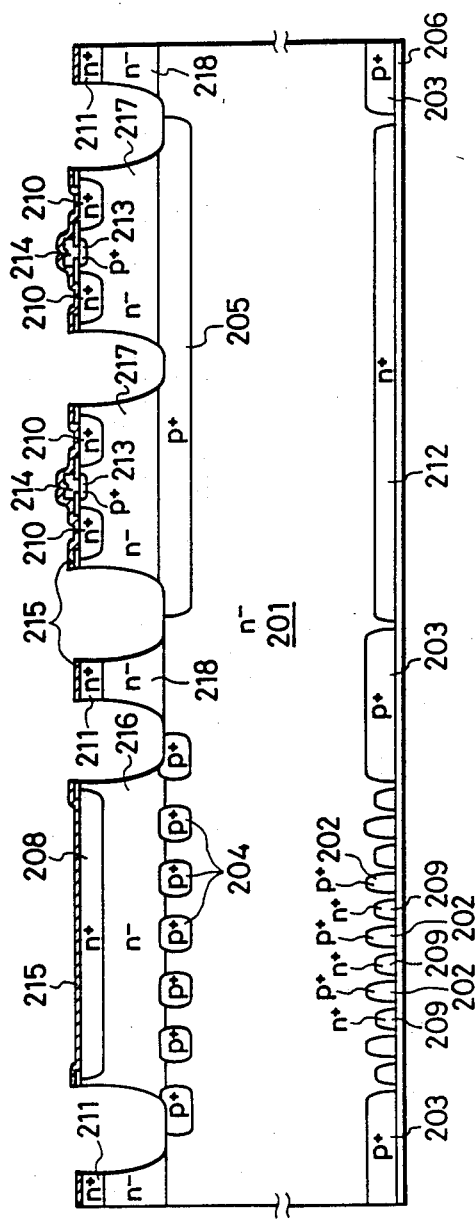
Figure 2F:
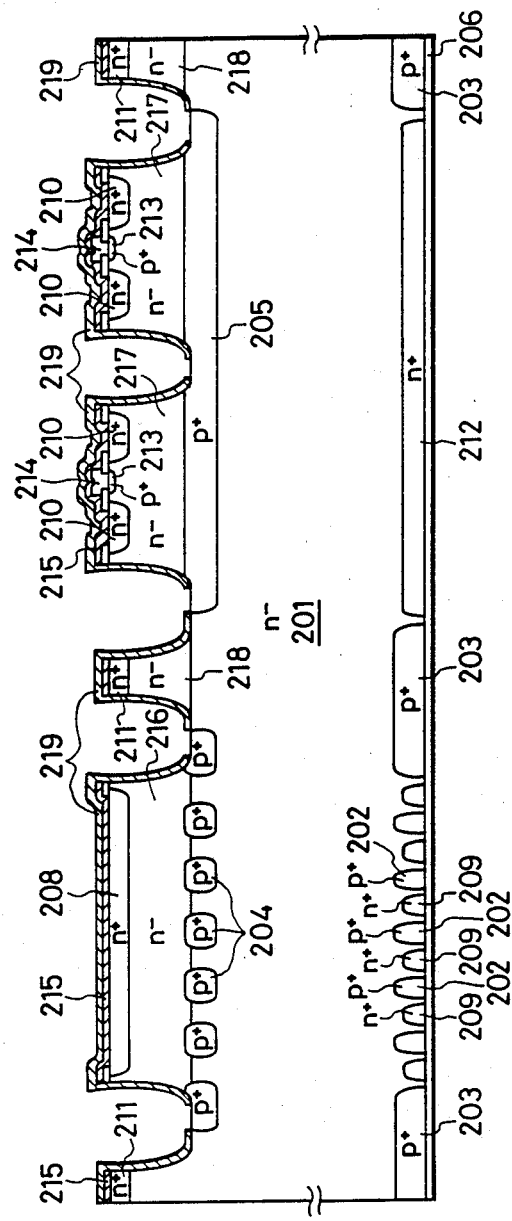
Figures 2G, 2H:
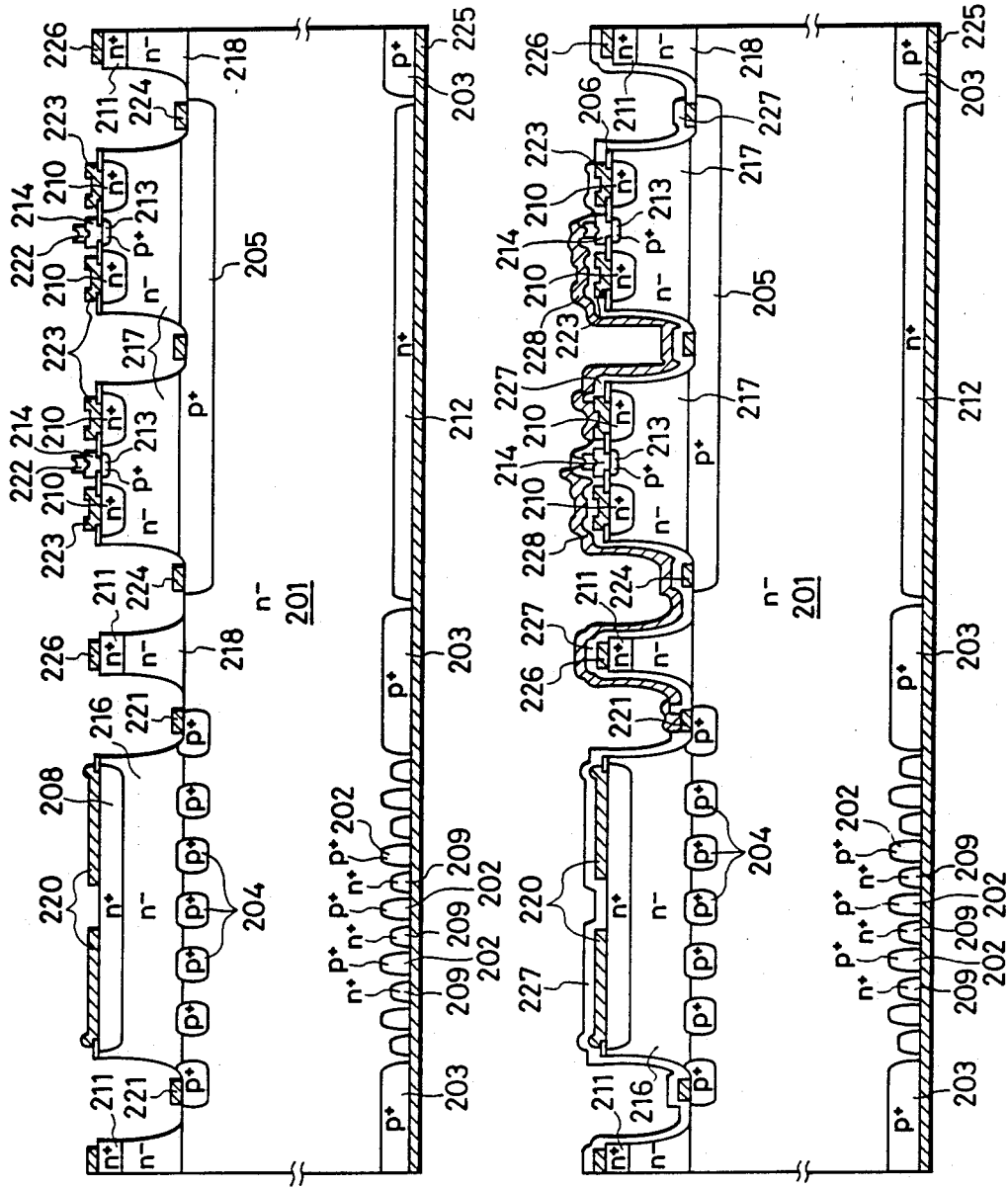

Now, a fabrication process of the integrated LTQSI thyristor according to the present invention will be described below. FIGS. 2A through 2H show sectional views visualizing the fabrication process of the integrated LTQSI thyristor having the formation illustrated in FIG. 1A. As shown in FIG. 2A, used as the substrate is an n− silicon wafer 201 having, for example, resistivity $\rho \approx 250$ to 500 $\Omega \cdot cm$, thickness on the order of 350 $\mu m$ and orientation of crystal face (111). Resistivity and thickness of the silicon wafer are determined depending on the blocking voltage of the LTSI thyristor to be manufactured. After oxidation of the n⁻ silicon wafer, boron B is thermally diffused selectively for forming the p+ anode region 202 of the LTSI thyristor, p+ region 203 right under the n+ isolation region, p+ gate region 204 of the LTSI thyristor and drain region 205 of the SIPTs. Impurity concentration $N_s$ and diffusion depth $X_j$ in the surface of the p+ gate region of the LTSI thyristor which are the factors, together with the pitch between two neighboring p+ gate regions 202, to determine characteristics of the LTSI thyristor are controlled, for example, so as to be $N_s=1\times 10^{20}$ to $10^{21}$ atm/cm³ and $X_j=10$ to 15 μm. Formation of the p+ anode regions 202 and the p+ regions 203 of the LTSI thyristor may be performed simultaneously with or separately from the formation of the p+ gate regins 204 of the LTSI thyristor and the p+ drain region 205 of the SIPT. Then, an n⁻ epitaxial growth layer corresponding to the n⁻ channel region of the SIPT are formed the layer between the p+ gate regions and n+ cathode region of the LTSI thyristor as shown in FIG. 2B. Since the epitaxial growth of silicon is performed at a temperature around 1100° C., impurities are automatically doped into the epitaxial growth layer 207 from the p+ gate regions 204 of the LTSI thyristor and the p+ drain region 205 of the SIPT. If an n⁻ layer having low impurity density is grown due to this phenomenon, the epitaxial growth layer will be of the p type and the gates of the p+ gate regions will be connected to one another through the p type of areas, thereby hindering an n⁻ channel from being formed. In order to solve this problem, a thin n layer having a relatively high impurity concentration of n type is grown first, and then an n⁻ layer is grown. For example, leaving an oxide film 206 on the anode side of the substrate, an n layer having an impurity density $\simeq 2\times 10^{16}$ cm⁻³ and thickness $\simeq 1$ μm is formed by growing for 1.5 minutes with $SiCl_4 + POCl_3 + H_2$ at 1100° C. using tetrachlorosilane SiCl₄, hydrogen H₂ as the carrier gas and POCl₃ as an impurity source, and thereafter H₂ is flowed for five minutes to purge POCl₃ from the reaction tube. Then, growth is performed for 27 minutes with $SiCl_4 + H_2$ to form an n⁻ layer having an impurity density $\simeq 1$ to $3\times 10^{14}$ cm⁻³ and thickness $\simeq 10$ to 20 μm. After oxidizing this layer once again, phosphorus (P) is thermally diffused selectively to form the n+ cathode regions 208 and n+ emitter regions 209 of the LTSI thyristor, the n+ gate regions 210 and n+ isolation regions 211 of the SIPT, and the n+ regions 212 right under the p+ drain region 205 of the SIPT by the known processes using the oxide film 206 as a mask as shown in FIG. 2C. Pitch between two neighboring n+ gate regions of the SIPT and diffusion depth $X_j$ are determined depending on characteristics of the SIPT. Diffusion depth $X_j$ is, for example, on the order of 3 to 7 μm. Then, the p+ source regions 213 of the SIPT are formed. From viewpoint of characteristics of the SIPT, the p+ source regions 213 should preferably have a shallow diffusion depth $X_j$ and high doping concentration. If aluminium is evaporation coated as an electrode directly to this thin diffusion layer, aluminium will pierce through the diffusion layer with high possibility, constituting a cause of degradation in yield rate. In order to solve this problem, the p+ source regions 213 should be formed by using a CVD polysilicon doped with boron B as a diffusion source or thermally diffusing boron B over the non-doped CVD polysilicon, and the polysilicon layer 214 should be used as a buffer layer for the metal electrodes and p+ source regions 213. For example, a nondoped polysilicon layer about 3500 Å can be formed by growth for 17 minutes by using the system of $SiCl_4 + H_2$. Thereafter, thin p+ regions can be formed by deposition of boron B at 1000° C. for 20 minutes and then a diffusion process at 1100° C. for 15 minutes. Then, after carrying out the known masking process, the CVD polysilicon layer 214 is subjected to patterning by plasma etching. Then, after opening the contact holes for connecting the n+ cathode regions 208 of the LTSI thyristor, and the n+ gate regions 210 and the n+ isolation regions 211 of the SIPT to the metal electrodes as shown in FIG. 2E, a silicon nitride film 215 is deposited. This silicon nitride film 215 is used as a masking material for providing electrodes in the p+ gate regions 204 of the LTSI thyristor and the p+ drain region 205 of the SIPT, and isolating the n⁻ layer 206, the p+ gate regions 204 and the n+ cathode regions 208 of the LTSI thyristor from the n⁻ layer 217 between the p+ source regions 213 and the p+ drain region 205 of the SIPT. The silicon nitride film 215 can be deposited to a thickness of about 1300 Å A by growth, for example, at 780° C. for 15 minutes. Requirements as characteristics of the masking material for silicon etching for this process are a property to permit formation at a temperature low enough not to change the impurity profile formed in the preceding processes and a high etching selection ratio relative to silicon, and CVDSnO₂, CVDSiO₂ or the similar material is utilizable as the masking material. After the masking process, the silicon nitride film 215 is subjected to patterning by plasma etching and the silicon nitride film removed by the plasma etching is further etched. Then, silicon is etched by using the silicon nitride film as a mask, and the p+ gate regions 204 of the LTSI thyristor and portion of the p+ drain region 205 of the SIPT are exposed as shown in FIG. 1E. The silicon etching is performed by the plasma etching method or chemical wet etching method. Whether or not the p+ gate regions and p+ drain region 205 have been exposed can be monitored through measurement by the four probes method, electrical conduction type of judgment with hot probe or the similar technique. Silicon is etched at a rate of about 10 μm/min by using, for example, an etching solution of HF: NHO₃: CH₃COOH = 15:100:5. Impurity density in the surfaces of the p+ regions 204 and 205 may be lowered depending on controllability of the etching, etching depth in the wafer surface, etc., thereby resulting in increase of resistance due to contact with the metal electrodes, and resistance of the exposed portions of the p+ regions 204 and 205. Such increase of resistance will cause degradation of switching characteristic of the LTSI thyristor. In order to solve the abovementioned problem, boron B is diffused by ion implantation into the exposed portions on the surfaces of the p+ regions 204 and 205 after the silicon etching. For example, aluminium is used as a masking material. A sheet resistance of several ohms/□ is obtainable by the ion implantation of B having a dosage of $3\times 10^{15}$ ions/cm² under an accelerating voltage of 50 kV, removing the masking aluminium and silicon nitride film 215, and annealing at 950° C. for 20 minutes. This process can also be carried out by thermal diffusion using a CVD nitride film, CVDSnO₂ or CVDSiO₂ as the masking material (see FIG. 2F). Then, both the surfaces of the semiconductor substrate are evaporation coated with aluminium as the electrodes shown in FIG. 2G and subjected to patterning. The aluminium electrode masking process need not be repeated so far as the n⁻ layer between the p+ gate regions 204 and n+ cathode regions 208 of the LTSI thyristor as well as the n− layer 217 between the p+ source regions 213 and p+ drain region 205 of the SIPT is relatively thin, and the pitch between the two neighboring aluminium electrode patterns of the SIPT is relatively wide. However, when said layer 217 is thick or the aluminium electrode patterns are thin and arranged at a narrow pitch, the patterning of the cathode electrodes 220 of the LTSI thyristor the source electrodes 222 and gate electrodes 223 of the SIPT, and the electrodes 226 on the n+ isolation regions should be carried out separately from the patterning of the gate electrodes 221 of the LTSI thyristor and the drain electrodes 224 of the SIPT. Further, there is available a method for thickening the electrodes of the LTSI thyristor, allowing a high current and thinning the electrodes of the SIPT having very thin patterns. For this purpose, evaporation coating of aluminium should be performed twice separately. Furthermore, finer electrodes of the SIPT can be patterned by flattening or filling the silicone-etched portions with a resisting material such as CVDSiO$_2$ film or polyimide type of resin before the aluminium electrode masking process. Then, wiring to the electrodes 228 in the second layer is carried out on both the sides of the films 227 for insulation between the layers as shown in FIG. 2H. CVDSiO$_2$ or a polyimide type of resin is used as the intermediate insulation films 227. After depositing or coating the intermediate insulation film 227, patterning is carried out to expose a portion of each electrode and then aluminium is evaporation coated to the second layer. Patterning is carried out for wiring the source electrodes of the auxiliary SIPT to the gate electrodes of the main SIPT, and the source electrodes of the main SIPT to the gate electrodes of the LTSI thyristor respectively.

By the fabrication process described above, it is possible to obtain the integrated LTQSI thyristor having the structure shown in FIG. 1A through 12 masking processes and with relatively easy process techniques.

Next, fabrication process for the integrated LTQSI thyristor having the structure shown in FIG. 1C will be described in the following. Since it is sufficient to perform uniform p+ diffusion on the anode side for this formation, the masking process is unnecessary on the anode side before diffusion of boron B for forming the p+ anode regions 104' and p+ gate regions 106 of the LTSI thyristor as well as the p+ drain region of the SIPT. Since the n+ emitter regions 105 shown in FIG. 1A need not be formed either, it is unnecessary to carry out the masking processes for forming the n+ cathode regions 101 of the LTSI thyristor, and the n+ gate regions 114, 124 and n+ isolation regions 131 of the SIPT before diffusion of phosphorus P. The other processes are similar to those described with reference to FIGS. 2A through 2H. This formation allows to omit two masking processes.

Then, descriptions will be made on the fabrication process of the integrated LTQSI thyristor according to the present invention having the structure illustrated in FIG. 1D. Before diffusing p+ on the anode side for forming the n buffer layer 181, deposition, ion implantation or diffusion of boon B is carried out. The subsequent processes are similar to those for the manufacturing processes for the structure shown in FIG. 1C. In addition, after forming the n buffer layer 181 on the n− substrate, the p+ anode regions 104 can be formed by bringing the p+ substrate into close contact with the n buffer layer 181, cementing said substrate through heat treatment and mechanically cutting the substrate into a thin plate.

The integrated LTQSI thyristor according to the present invention having the structure shown in FIG. 1E is manufactured by the method described below. The manufacturing processes of this formation are the same as those described with reference to FIGS. 2A through 2H, except for the shapes of the masks used for forming the anode regions and the n+ emitter regions.

The integrated LTQSI thyristor according to the present invention having the structure shown in FIG. 1F can be fabricated by the processes explained below. Since the n+ region 182 has a diffusion depth is larger than those of the n+ cathode regions 101 of the LTSI and n+ gate regions 114 and 124 of the SIPT in this case, it is necessary to carry out the diffusion for the n+ region 182 separately from that for the n+ cathode regions 101 of the LTSI and the n+ gate regions 114, 124 of the SIPT. When boron B and phosphorus P are used as the p type of impurity and n type of impurity respectively, diffusion of boron B should be carried out first for forming the p+ anode regions 104, p+ gate regions 106 and p+ drain region 113, and then phosphorus P should be diffused for forming the n+ region 182, taking into consideration the fact that the diffusion coefficient of boron B is smaller than that of phosphorus P. The processes on and after the epitaxial growth of the n− layer are the same as those for the LTQSI thyristor having the structure shown in FIG. 1C.

Explanation will be made on the fabrication process of the integrated LTQSI thyristor having the formation illustrated in FIG. 1G. In this case, diffusion of phosphorus P is carried out first to form the n buffer layer 181. The subsequent processes are quite the same as those for the integrated LTQSI thyristor having the formation shown in FIG. 1F.

Finally, fabrication process of the integrated LTQSI thyristor according to the present invention illustrated in FIG. 1H will be described. The fabrication processes of the integrated LTQSI thyristor having the structure shown in FIG. 1H are the same as those explained with reference to FIGS. 2A through 2H, except for the shape of the mask for forming the anode regions and that of the mask for forming the n emitter regions.

In the fabrication processes of the integrated LTQSI thyristor according to the present invention, it is effective, for reducing the tailing current at the turn-off time and increasing the turn-off gain, to diffuse a heavy metal such as gold or platinum into the second base region of the LTSI thyristor and/or irradiate said LTQSI thyristor with a radiation such as electron beam, gamma ray, beta ray or proton etc. under a condition that power-loss of the LTQSI thyristor is not increased so much at a suitable operating frequency used.

The integrated light-triggered and light-quenched static induction thyristor according to the present invention enables to increase the value of the turn-off gain $G_{off}$ since said thyristor permits reducing the tail current at the light-quenching time.

Accordingly, it is possible to limit the area occupied by the light-quenched SIPT or SIPT darlington circuit portion to about $1/G_{off}$ relative to the entire chip area. In a case where 100A is to be quenched by light, for example, on an assumption of $IG_{off}=10A$ and $G_{off}=10$, the area occupied by the photodarlington circuit portion composed of the main SIPT and auxiliary SIPT may be about 11% of the area of the light-triggered SI thyristor. For an element on the order of 100A, the entire chip has an area of about 18 mm$\phi$. Needless to say, higher speed operations can be realized by setting turn-off gain at 2 to 3 and designing the SIPT portion so as to have a larger area.

It is therefore possible to design in such a manner that the area occupied by the light-quenched SIPT or SIPT darlington circuit portion is smaller than the light-triggered SI thyristor.

As for the light triggering pulse (LT) and light quenching pulse (LQ), it is desirable to select light sources having wavelengths in the vicinity of wavelengths $\lambda_T$ and $\lambda_Q$ which give the peaks of the spectral response of the light-triggered SI thyristor and SIPT respectively. For example, $\lambda_Q$ and $\lambda_T$ will be selected on the order of 780 nm and 950 nm respectively. Alternately, it is possible to mount an infrared filter having a cut-off band between $\lambda_Q$ and $\lambda_T$ over the SIPT portion as shown in FIG. 1A.

Now, an example of the characteristics will be described on the Embodiment 1 shown in FIGS. 1A and 1B which has the most fundamental structure among the embodiments explained above. An element having a forward blocking voltage of 1000 V and a rated forward current of 10A was fabricated. The LTSI thyristor had an area of 5.34×3.92 mm$^2$, length of unit channel on the mask of 304 $\mu$m, number of channels of 777, pitch between two neighboring gate regions of 29 $\mu$m, width of the diffusion window of the p$^+$ gate region of 5 $\mu$m, and aperture efficiency for incident light of 33.2%. On the other hand, the main SIPT in the quenching photodarlington type of SIPT had an area of 2.16×3.56 mm$^2$, length of the unit source region of 1219 $\mu$m, number of the source regions of 174, pitch between two neighboring n$^+$ gate regions of 10 $\mu$m, width of the diffusion window for the n$^+$ gate region of 15 $\mu$m and aperture efficiency for incident light of 19.8%. Further, the SIPT for amplification had an area of 0.53×1.68 mm$^2$, length of the unit source region of 1281.5 $\mu$m, number of the source regions of 21, pitch between two neighboring n$^+$ gate regions of 10 $\mu$m, width of the diffusion window for the n$^+$ gate region of 15 $\mu$m, and aperture efficiency for incident light of 39.5%.

Figure 3A:
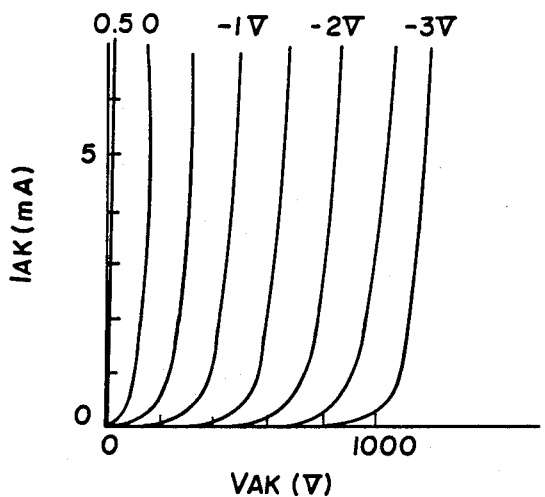
FIG. 3A is a photograph of an oscillogram illustrating the forward blocking characteristic of the LTSI thyristor portion of the integrated LTQSI thyristor manufactured according to the present invention.
Figure 3B:
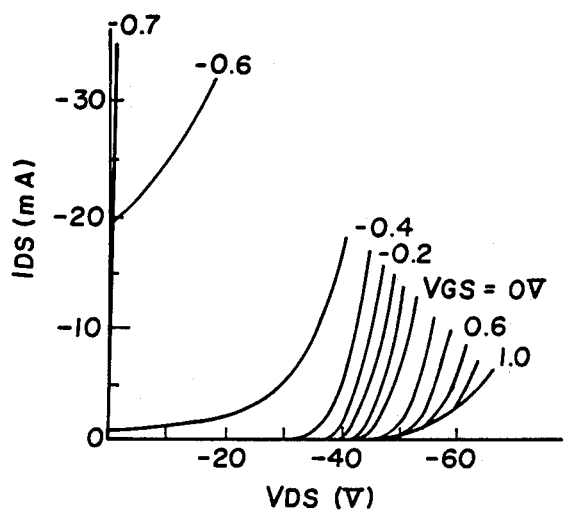
FIGS. 3B and 3C are photographs of oscillograms illustrating the static characteristics of the integrated main SIPT.
Figure 3C:
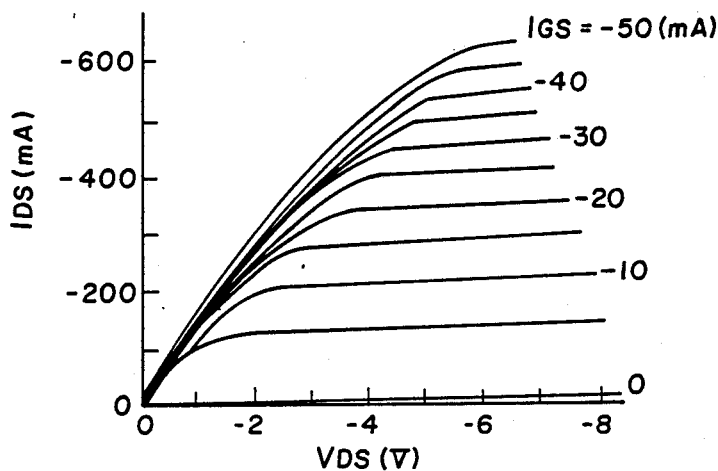
Figure 3D:
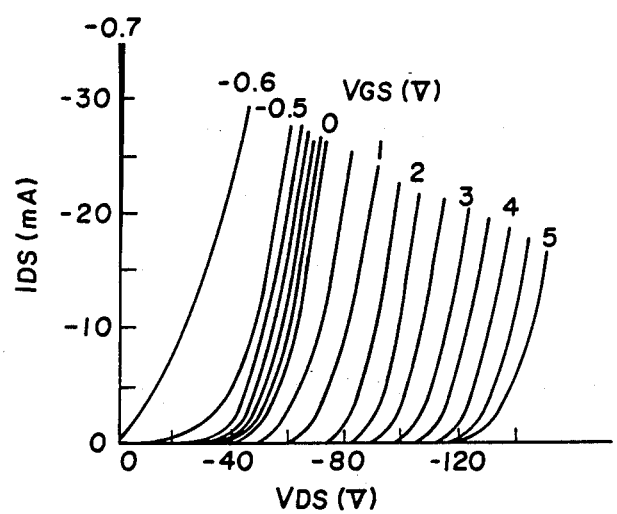
FIGS. 3D and 3E are photographs of oscillograms illustrating the static characteristics of the integrated SIPT for amplification (auxiliary SIPT)
Figure 3E:
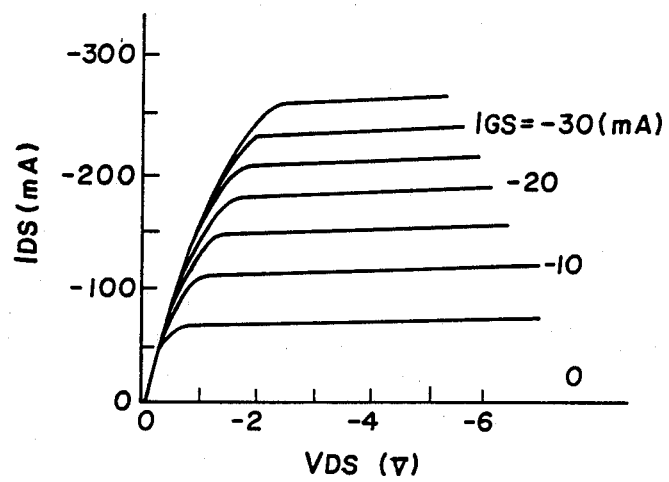
Figure 3F:
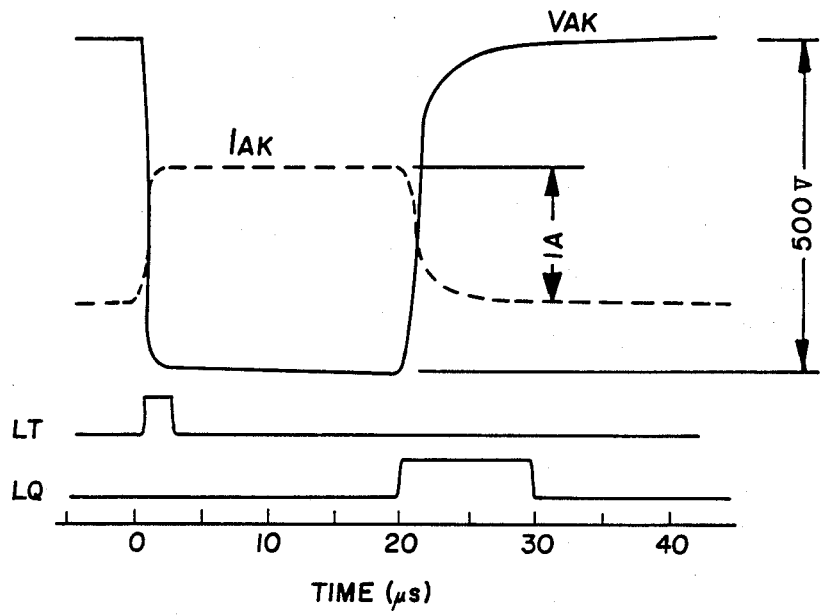
FIG. 3F is a photograph of an oscillogram illustrating optical switching waveform of the fabricated 1000 V-10 A class integrated LTQSI thyristor according to the present invention.
Figure 4:
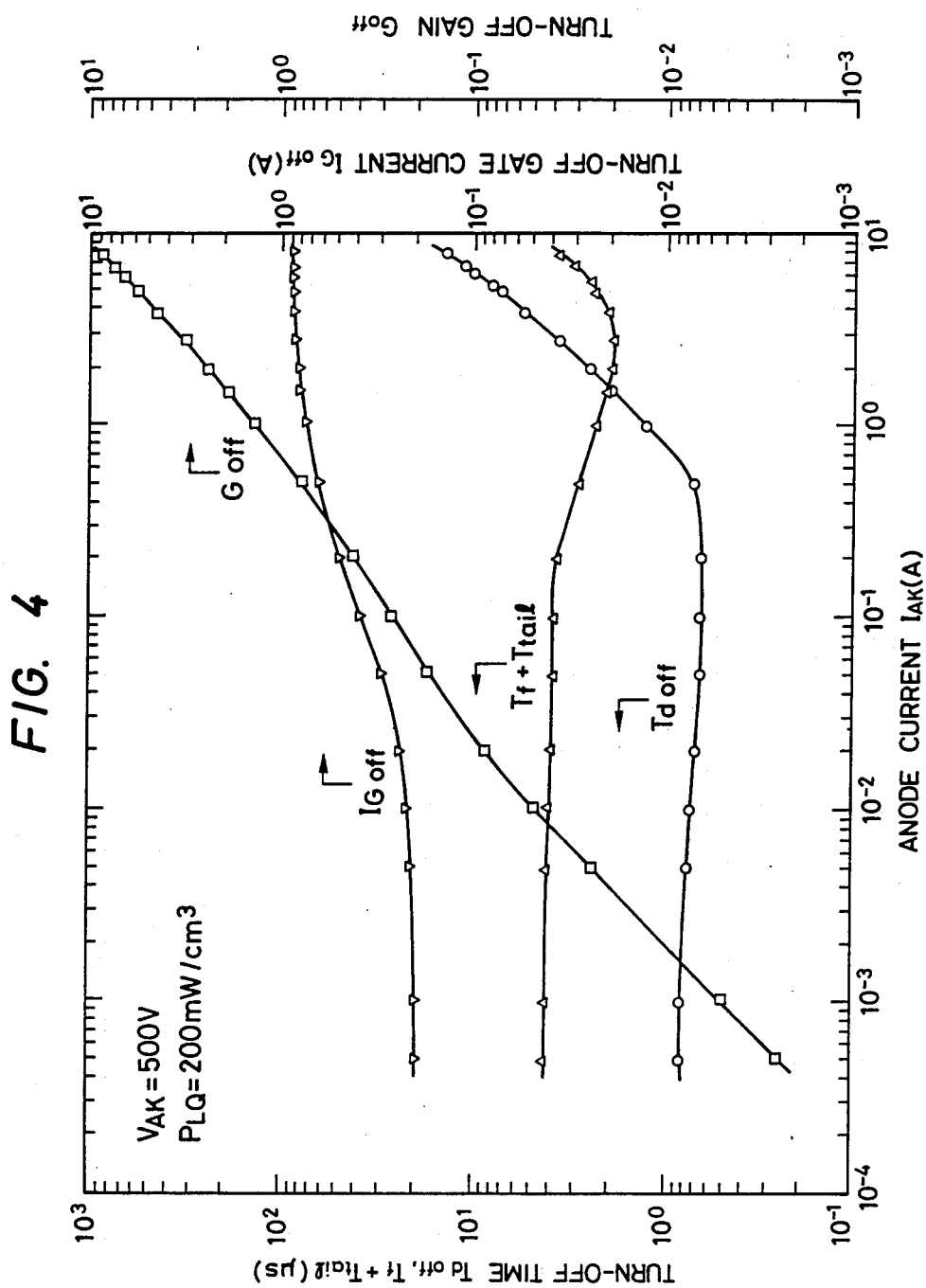
FIG. 4 is a diagram illustrating relationship among turn-off time, turn-off gate current, turn-off gain and anode current of the fabricated 1000 V-10 A class integrated LTQSI thyristor according to the present invention.

FIGS. 3A through 3F present photographs of oscillograms illustrating the static characteristics of the integrated LTQSI thyristor fabricated by the fabrication process according to the present invention. FIG. 3A shows the forward blocking characteristic of the LTSI thyristor. Speaking concretely, the LTSI thyristor has the normally-on type of characteristic and blocks an anode voltage $V_{AK}=1000$ V at a gate bias voltage $V_{GK}=-3$ V. Voltage amplification factor is $\mu \approx 330$. FIGS. 3B and 3C illustrate the drain current $I_{DS}$−drain voltage $V_{DS}$ characteristic of the main SIPT in the quenching photodarlington type of p channel SIPT. This element has an area of 2.16×1.78 mm$^2$. FIG. 3B shows the $I_{DS}$−$V_{DS}$ characteristic in the low current region. FIG. 3C shows the $I_{DS}$−$V_{DS}$ characteristic in the high current region. The LTQSI thyristor blocks about 50 V at a gate bias voltage $V_{GS}=0$ V. Further, said LTQSI thyristor is capable of flowing a drain current $I_{DS}=-600$ mA at a gate current $I_{GS}=-50$ mA. FIGS. 3D and 3E show the drain current $I_D$−drain voltage $V_D$ characteristic of the auxiliary SIPT (for amplification) in the quenching photodarlington type of p channel SIPT. FIG. 3D illustrates the $I_{DS}$−$V_{DS}$ characteristic in the low current region, whereas FIG. 3E illustrates the $I_{DS}$−$V_{DS}$ characteristic in the high current region. That is to say, the SIPT can block a drain voltage $V_{DS}=-20$ V at a gate bias voltage $V_{GS}=0$ V and $V_{DS}=-120$ V at $V_{GS}=+5.0$ V respectively as apparent from FIG. 3D. Further, as is clear from FIG. 3E, said SIPT is capable of flowing $I_{DS}=-300$ mA at a gate current $I_{GS}=-50$ mA. FIG. 3F is a photograph of an oscillogram illustrating the light switching waveform of an integrated LTQSI thyristor of the 1000 V−10 A class fabricated by the process according to the present invention. Used as a light source was an LED composed of GaAs having a central wavelength of 780 nm and a rise time of 12 ns. In FIG. 3F, the reference symbol $V_{AK}$ represents an anode voltage waveform, the reference symbol $I_{AK}$ designates an anode current waveform, the reference symbol LT denotes a waveform of triggering light pulse and the reference symbol LQ represents a waveform of quenching light pulse: said triggering light being used for irradiating the LTSI thyristor and said quenching light being used for irradiating the auxiliary SIPT. FIG. 4 shows dependencies o turn-off time $t_{off}$, turn-off gate current $I_{Goff}$ and turn-off gain $G_{off}$ on anode current $I_{AK}$ at the light quenching operation time. $V_{AK}=500$ V and $I_{AK}=8.8$ A are turned off within 20 $\mu$sec. Turn-off gain is 9 in this case. FIG. 5 shows spectral response characteristics of the SIPT, LTSI thyristor, and diode between the gate and anode. The SIPT has the maximum sensitivity at a wavelength of 775 nm and the LTSI thyristor has the maximum sensitivity at 950 nm. Accordingly, it is effective to select a triggering light source having wavelength in the vicinity of 775 nm and a quenching light source having a wavelength in the vicinity of 950 nm. It is possible to suppress the influence on the SIPT due to the triggering light and the effect of the quenching light acting as the triggering light for the LTSI thyristor by mounting wavelength cut-off filters over the LTSI thyristor and SIPT.

Figure 6A:
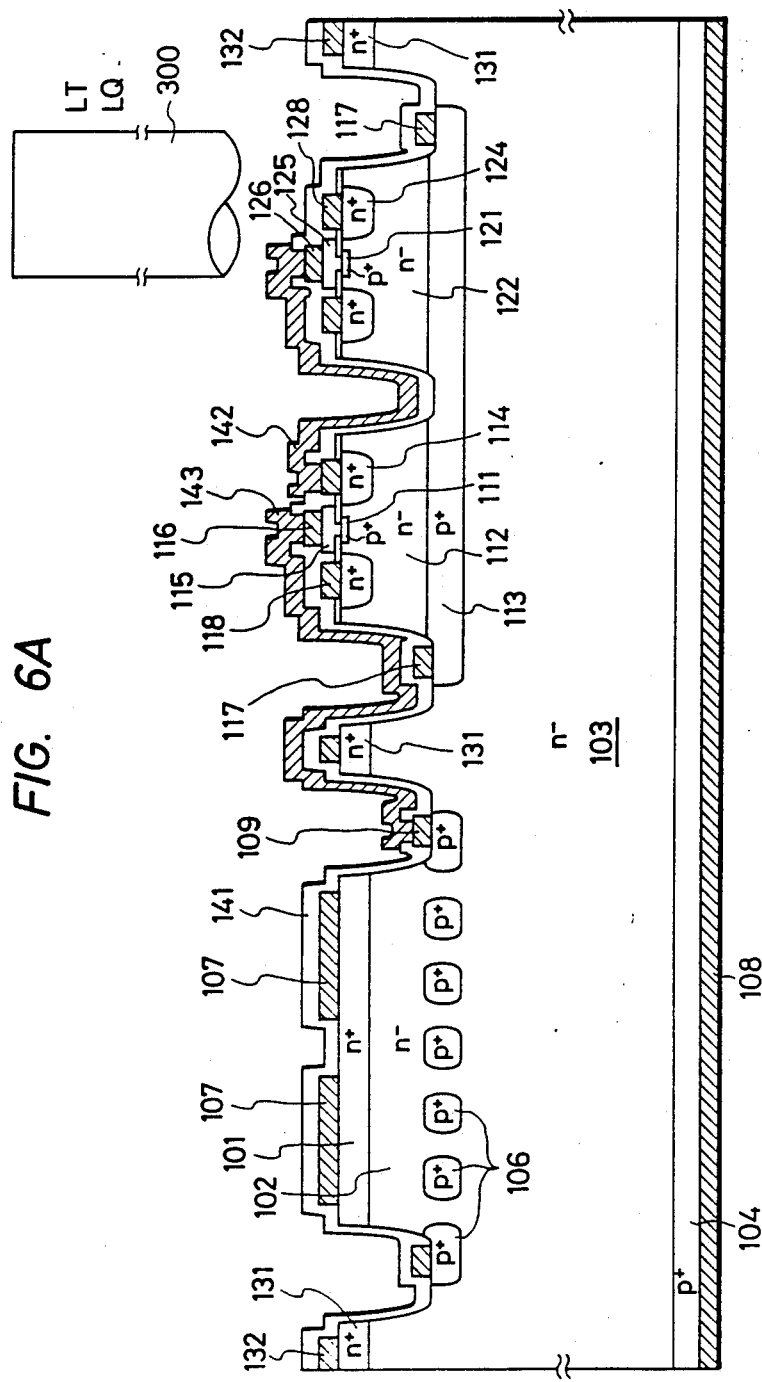
FIGS. 6A and 6B are a sectional view and top view illustrating another embodiment of the integrated LTQSI thyristor according to the present invention.
Figure 6B:
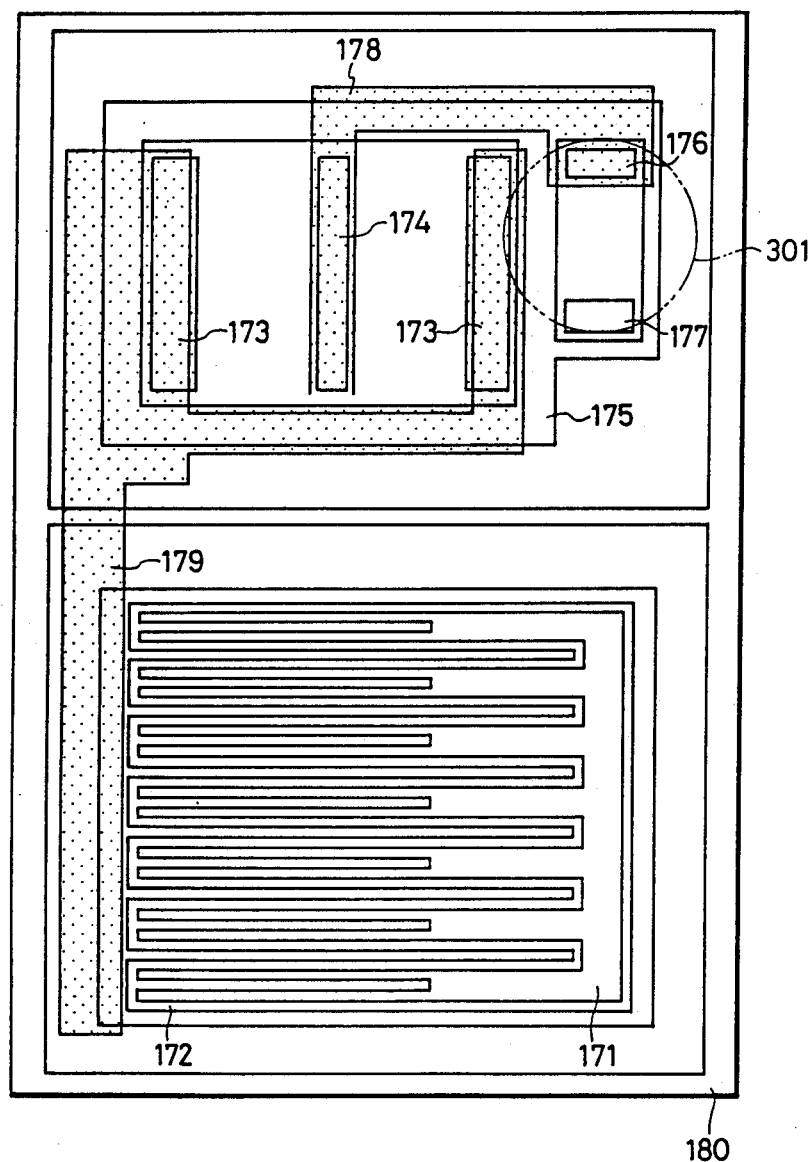

FIGS. 6A and 6B show an embodiment so adapted as to turn on and off the integrated light-triggered and light-quenched static induction thyristor by light while leading light triggering pulse LT and light quenching pulse LQ through a single light transmission medium 300. This embodiment has a sectional formation which is substantially the same as that of the embodiment shown in FIG. 1C, and is so adapted as to be capable of leading light triggering pulses and light quenching pulses having peak wavelengths close to the optimum triggering wave-length $\lambda_T$ and optimum quenching wavelength $\lambda_Q$ through a suitable light transmission medium 300. In this case, switching between the light triggering pulse LT and light quenching pulse LQ may be performed by emitting and extinguishing two independent light sources while switching mechanically or electrically. Further, this embodiment uses a single light transmission medium and therefore has a characteristic to simplify actual fabrication processes as compared with the embodiments employing plural light transmission means. Optical fibers, bundle fibers, lenses, rod lenses, etc. can be used as the light transmission means. In FIG. 6B, the reference numeral 301 represents the position or range irradiated on the element surface of the auxiliary SIPT (for amplification) with the light to be led through the light transmission medium 300. In case where a single light transmission medium is used as in this embodiment, it is desirable to select a formation wherein the p$^+$ regions exist in the projected area, on the anode surface, of the drain regions of the SIPT group as shown in FIGS. 1C and 1D. Though this formation allows the electrons among the pair generated electron-hole pairs in the n⁻ layer by the light triggering pulses to be accumulated in the vicinity of the anode and induces hole injection from the anode p⁺ regions, a higher injection efficiency is more desirable. In cases where the light penetration depth and electron diffusion length $L_n$ are long, required operations are sufficiently possible with the single light transmission medium in the embodiments having formations other than those shown in FIGS. 1C and 1D.

The integrated LTQSI thyristor according to the present invention can easily be designed as an element having an element area smaller than 20 mm in diameter, a blocking voltage of 1600 V—rated forward current on the order of 100 A.

What is claimed is:

1. An integrated light-triggered and light-quenched static induction thyristor assembly comprising:
   a buried-gate type of light-trigged static induction thyristor comprising:
   first conductivity type and regions formed on a first main surface of a high-resistivity substrate,
   gate regions having a first conductivity type and a high impurity density, partially buried into said substrate in the vicinity of a second main surface of said high-resistivity subtrate,
   a second conductivity type high-resistivity epitaxial layer formed in a way to bury said gate regions,
   a cathode region having a second conductivity type and a high impurify density, formed by diffusion into said epitaxial layer,
   cathode electrodes formed on said cathode regions and having windows for allowing triggering light pulses to penetrate therethrough,
   gate electrodes formed on said gate region,
   anode electrodes formed on said first main surface,
   a common drain region having said first conductivity type and an high impurity density and partially buried into said substrate in the vicinity of said second main surface of said substrate;
   first and second high-resistivity channel regions so formed as to bury said drain region and having said second conductivity type, said first and second channel regions isolated from each other;
   at least two first gate regions of said second conductivity type formed in said first channel region and at least two second gate regions of said second conductivity type formed in said second channel region;
   first source regions of said first conductivity type formed between adjacent ones of said first gate regions, and second source regions of said first conductivity type formed between adjacent ones of said second gate regions;
   isolation regions formed between said cathode regions and said first channel region, and having said second conductivity type and high impurity density;
   drain electrodes formed on said common drain region;
   first and second gate electrodes formed on said first and second gate regions respectively; and
   first and second source electrodes formed on said first and second source regions respectively;
   said first gate electrode on said first channel region and said second source electrode being connected to each other with a wire arranged through an insulating layer,
   a wire arranged through an insulating layer for connecting said gate electrodes and said first source electrodes;
   said isolation regions electrically isolating said buried-gate type of light trigged static induction thyristor from said darlington circuit, and arranged along the circumferences of said buried-gate type of static induction thyristor and said photodarlington circuit,
   wherein a first static induction phototransistor is formed by said common drain region, said first channel region, said first gate regions on said first channel region, and said first source region, and a second static induction phototransistor is formed by said common drain region, said second channel region, said second gate regions on said second channel region, and said second source region, said first and second static induction phototransistors forming a darlington circuit;
   wherein said isolation regions electrically isolate said light triggered static induction thyristor from said darlington circuit, and are arranged along the circumferences of said light-trigged static induction thyristor and said photodarlington circuit, and
   whereby said light-trigged and light-quenched static induction thyristor are turned on by said triggering light pulses irradiated through said windows formed in said cathode electrodes, and are turned off by quenching light pulses irradiated on said static induction phototransistors.

2. An integrated light-triggered and light-quenched static induction thyristor according to claim 1 characterized in that said isolation regions are formed by etching the high-resistivity substrate isolating said common drain region from said buried-gate regions.

3. An integrated light-triggered and light-quenched static induction thyristor according to claim 1 characterized in that said anode regions are uniformly diffused layers having the same depth.

4. An integrated light-triggered and light-quenched static induction thyristor according to claim 1 characterized in that said anode regions are formed in the projected area, on the first main surface, of the area wherein said buried-gate regions and isolation regions are to be formed.

5. An integrated light-triggered and light-quenched static induction thyristor according to claim 4 characterized in that said thyristor further comprises high impurity density regions conductive inversely to the anode regions and shallower than said anode regions on said first surface at the intermediate area wherein said anode regions are formed.

6. An integrated light-triggered and light-quenched static induction thyristor according to claim 5 characterized in that said anode regions and said inversely conductive regions having high impurity density are formed also in the projected area, on the first main surface, of said common drain region wherein said photodarlington circuit is formed.

7. An integrated light-triggered and light-quenched static induction thyristor according to claim 5 characterized in that the pitch between the two neighboring anode regions is shorter than the twice the length of the diffusion length $L_n$ ($2L_n$) of electrons in the vicinity of said anode regions.

8. An integrated light-triggered and light-quenched static induction thyristor according to claim 5 characterized in that the high-resistivity substrate region between two of said anode regions is substantially kept in depletion condition due to diffusion potential between said anode regions and high-resistivity substrate regions.

9. An integrated light-triggered and light-quenched static induction thyristor according to claim 3 characterized in that said thyristor further comprises a buffer layer conductive inversely to said anode regions and having an impurity density of $10^{15}$ to $10^{18}$ cm$^{-3}$ between said anode regions and said high-resistivity substrate.

10. An integrated light-triggered and light-quenched static induction thyristor according to claim 1 characterized in that said thyristor further comprises high impurity concentration regions conductive inversely to said anode regions, shallower than said anode regions and formed in the projected area, on the first main surface, of said cathode regions and said common drain region, and said anode regions are formed in the rest area of said first main surface.

11. An integrated light-triggered and light-quenched static induction thyristor according to claim 1 characterized in that said anode regions are formed in the projected area on the first main surface, of said cathode regions and said thyristor further comprises high impurity concentration regions conductive inversely to the anode regions formed in the rest area of said first surface and having a depth similar to that of said anode regions.

12. An integrated light-triggered and light-quenched static induction thyristor according to claim 11 characterized in that said anode regions and said high impurity density regions conductive inversely to said anode regions are formed on the surface kept in contact with said high-resistivity substrate, and said thyristor further comprises a buffer layer conductive inversely to said anode regions and having uniform thickness.

13. An integrated light-triggered and light-quenched static induction thyristor according to claim 1 characterized in that said thyristor further comprises anode regions formed in the projected area, on the first main surface, of said cathode regions and said isolation regions, high impurity density regions conductive inversely to said anode regions, having shallower depth than said anode regions and formed in the projected area, on the first main surface, of said drain region, and high impurity density regions conductive inversely to said anode regions, having shallower depth than said anode regions and formed in the projected area, on the first main surface, of said cathode regions and buried-gate regions.

14. An integrated light-triggered and light-quenched static induction thyristor according to claim 1 characterized in that impurity density of said anode regions is lower than $10^{17}$ cm$^{-3}$.

15. An integrated light-triggered and light-quenched static induction thyristor (LTQSI thyristor) according to claim 1 characterized in that a heavy metal is diffused into said LTQSI thyristor or said LTQSI thyristor is irradiated with a radiation of electron beam, gamma ray or proton beam in order to shorten the lifetime of minority carriers in the vicinity of said anode regions.

16. An integrated light-triggered and light-quenched static induction thyristor according to claim 1 characterized in that said thyristor further comprises infrared cut filters mounted on the surface for receiving the light quenching pulses from the static induction phototransistor forming said photodarlington circuit and having a cut band between the spectral response peak wavelength of said light-triggered static induction thyristor and the spectral response peak wavelength of said static induction phototransistor.

17. An integrated light-triggered and light-quenched static induction thyristor according to claim 1 characterized in that the triggering light and quenching light are transmitted to said static induction phototransistor through a single light transmission medium, and lights having wavelengths in the vicinity of the spectral response peak wavelengths are used for irradiation at turn-on and turn-off times respectively.

18. An integrated light-triggered and light-quenched static induction thyristor according to claim 1 characterized in that said photodarlington circuit portion formed by said static induction phototransistor has an area smaller than that of said light-triggered buried-gate type of static induction thyristor.

* * * * *

UNITED STATES PATENT AND TRADEMARK OFFICE
CERTIFICATE OF CORRECTION

PATENT NO. : 4,866,500

DATED : September 12, 1989

INVENTOR(S) : Jun-ichi NISHIZAWA, Takashige TAMAMUSHI and Ken-ichi NONAKA

It is certified that error appears in the above-identified patent and that said Letters Patent is hereby corrected as shown below:

Title Page

[73] Assignee: Zaidan Hojin Handotai Kenkyu
Shinkokai, Sendai, Japan

Col. 13, Claim 1, line 5 thereof, after "type" change "and" to -- anode --.

Signed and Sealed this

Twenty-seventh Day of August, 1991

*Attest:*

HARRY F. MANBECK, JR.

*Attesting Officer*     *Commissioner of Patents and Trademarks*